United States Patent [19]

Lin

[11] Patent Number: 5,861,333
[45] Date of Patent: Jan. 19, 1999

[54] METHOD OF TUNNEL WINDOW PROCESS FOR EEPROM CELL TECHNOLOGY

[75] Inventor: Kun-Chi Lin, Hsinchu, Taiwan

[73] Assignee: United Microelectonics Corp., Hsinchu, Taiwan

[21] Appl. No.: 738,328

[22] Filed: Oct. 25, 1996

[51] Int. Cl.⁶ .................................................. H01L 21/8247
[52] U.S. Cl. ........................................... 438/258; 438/263
[58] Field of Search ..................................... 438/258, 262, 438/263, 264, 297

[56] References Cited

U.S. PATENT DOCUMENTS

| | | | |
|---|---|---|---|
| 5,032,533 | 7/1991 | Gill et al. | 438/263 |
| 5,173,436 | 12/1992 | Gill et al. | 438/263 |
| 5,411,908 | 5/1995 | Santin et al. | 438/263 |
| 5,597,750 | 1/1997 | Pio et al. | 438/258 |

*Primary Examiner*—Chandra Chaudhari
*Attorney, Agent, or Firm*—Ladas & Parry

[57] ABSTRACT

The present invention includes forming a first field oxide region (FOX) on a substrate. Buried $N^+$ regions are then formed. Subsequently, a plurality of second FOX regions are formed. A tunneling window region between the second FOX regions is narrowed by the formation of the second FOX regions. Then a tunnel oxide is formed on the substrate. A first polysilicon layer is deposited on the first FOX, the second FOXs, the gate oxide, the tunnel oxide and the substrate. An etching step is used to define the floating gate. A dielectric layer is formed on the floating gate. A second polysilicon layer is then formed on the dielectric layer. The second polysilicon layer and the dielectric layer are etched. An ion implantation step is used to form source and drain of the gate.

23 Claims, 6 Drawing Sheets

METHOD OF TUNNEL WINDOW PROCESS FOR EEPROM CELL TECHNOLOGY

FIELD OF THE INVENTION

The present invention relates to a electrically erasable programmable read only memory (EEPROM), and more specifically, to a method of tunnel window process which beyond the photolithography limitation.

BACKGROUND OF THE INVENTION

Non-volatile memory has divided for applied reasons into four fairly distinct product segments. These include mask read only memory, electrically erasable programmable read only memory (EEPROM), erasable programmable read only memory (EPROM) and the, EEPROM-EAROMs. Different types of devices have been developed for specific applications requirements in each of these segments. The EEPROM basic technologies used to manufacture electrically reprogrammable ROMs all utilized to some extent Fowler-Nordheim tunneling which is cold electron tunneling through the energy barrier at a silicon-silicon dioxide interface and into the oxide conduction band. EEPROMs using field effect transistors with floating-gate structures are programmed and erased by electrically storing and removing charges from the dielectric-insulated floating gates. The digital information stored in EEPROMs is read by differentiating between the source-drain impedance presented by a charged (high voltage threshold Vt) floating gate and an uncharged (low floating gate) floating gate.

In EEPROMs, electrons are transferred to a floating gate electrode through a dielectric layer overlying the channel region of a transistor. The EEPROMs is programmed by applying a high positive voltage to the control gate electrode and a lower positive voltage the drain region. Electrons are transferred from the tunneling window region to the floating gate electrode. The EEPROMs is erased by grounding the control gate, and applying a high positive voltage to either the source or drain regions of an enhancement transistor. Under the conditions, electrons are removed from the floating gate and into either the source or drain regions.

A conventional methods of forming EEPROM is described herein. As shown in FIG. 1, a semiconductor substrate 1 is p type single crystal with <100> crystallographic orientation. First, a thick field oxide region (FOX) 3 is formed for the purposes of isolation. The FOX 3 region is created via photolithography and dry etching steps to etch a silicon nitride-silicon dioxide composite layer. After the photoresist is removed and wet cleaned, a thermal oxidation in an oxygen steam ambient is used to form the FOX 3 region, at a thickness about 7000–9000 angstroms.

Then a first photoresist is patterned on the substrate 1. Subsequently, an ion implantation is used to form a buried $N^+(BN^+)$ source and drain region of a stack transistor. The dosage of the implantation is 2-4E15 atom/cm$^2$, the energy of the implantation is about 50–80 KeV. Then the first photoresist is stripped after the source and drain regions are formed.

As shown in FIG. 12, a mask 31 is patterned on the substrate to define an active region. Then a mask 29 is formed to cover a portion of the active region and define a buried $N^+(BN^+)$ source and drain region.

Turning to FIG. 2, a silicon dioxide layer 5 is formed on the substrate 1 to act as a gate oxide 5. The silicon dioxide layer 5 is formed by using an oxygen-steam ambient, at a temperature between about 800 to 900° C., to a thickness about 200–400 angstroms. A second photoresist 7 is then patterned on the field oxide 3 and on the silicon dioxide layer 5. An opening is generated in the silicon dioxide layer 5 by using a wet etching to etch the silicon dioxide layer 5. The photoresist 7 is then removed.

As shown in FIG. 13, a mask 33 is patterned on the substrate to expose a portion of the $N^+(BN^+)$ source and drain region and to define a tunnel region. A mask 34 is used to define a first polysilicon layer.

Turning to FIG. 3, a thermal treatment is performed to the substrate 1. This step of the process is used to create a tunnel oxide 9. Similarly, the tunnel dioxide 9 is formed by using an oxygen-steam ambient, at a temperature between about 800° to 900° C., to a thickness about 90–110 angstroms. The silicon dioxide layer 5 became thicker due to the thermal treatment. A first polysilicon layer 11 is then formed over the silicon dioxide layer 5, tunnel oxide layer 9 and the field oxide regions 3. The first polysilicon layer 11 is formed using conventional chemical vapor deposition (CVD), which is served as a floating gate. Then an etching step is used to etching the first polysilicon layer 11 to define the floating gate of the EEPROM.

Referring next to FIG. 4, a dielectric layer 13 is formed on the first polysilicon layer 11 for the purpose of isolation. The dielectric layer 13 is formed of oxide. Next, an etching step is used to etch the dielectric layer 13 to serve as an isolating layer. Subsequently, a second polysilicon layer 15 is formed on the dielectric layer 13. After the polysilicon layer 15 is formed, photolithography and etching are performed to etch the polysilcon layer 15 to define a control gate 15 and a pass gate 19.

Turning to FIG. 5, a second dielectric layer 21 is subsequently deposited on the substrate 1, control gate 17 and on the pass gate 19 to a thickness about 4000–7000 angstroms. A contact window 23 is then created by using photolithography and etching process. The second dielectric layer 21 is composed of BPSG. Finally, a metal layer 25 is formed on the second dielectric layer 21 and the contact window 23 is filled with the metal layer 25 to serve as a bit line contact.

FIG. 14 shows a mask 35 is patterned to define a second polysilicon region and a mask 36 to define a contact hole in the active region. A mask 37 is used to define a metal bit line region.

However, to increase the density of semiconductor devices has been the trend in integrated circuit technology. In order to increase the packaging density, it trends to shrink the scale of a device. It follows then that the semiconductor devices, such as transistors and capacitors, must be made smaller and smaller. Unfortunately, one area which poses as a significant barrier to the miniaturization of semiconductor devices is photolithography. The photolithography has a limitation because of the resolution of the photolithography.

SUMMARY OF THE INVENTION

The formation of the double poly electrically erasable programmable read only memory (EEPROM) is described herein. A thick first field oxied region (FOX) is created for purposes of isolation. Generally speaking, the first FOX region is created via photolithography and dry etching steps to etch a silicon nitride-pad oxide composite layer. After photoresist is removed, and wet cleans, a thermal oxidation in an oxygen steam ambient is used to form the first FOX region. Then photolithography and etching steps are used again to etching the silicon nitride-pad oxide composite layer. An ion implant is then performed to create buried $N^+(BN^+)$ impurity regions. Subsequently, a thermal oxidation in an oxygen steam ambient is used to form a plurality of second FOX regions. A tunneling window region between the second FOX regions has a dimension beyond the photolithography limitation. The tunneling window region is narrowed by the formation of the bird beaks of the second FOX regions. Then a tunnel oxide is formed on the substrate. A first polysilicon layer is deposited on the first FOX, the second FOXs, the gate oxide, the tunnel oxide and the substrate. An etching step is used to define the floating gate. A dielectric layer is formed on the floating gate. A second polysilicon layer is then formed on the dielectric layer. The second polysilicon layer is used for forming a control gate and a pass gate. Photolithography and etching are used to etch the second polysilicon layer and dielectric layer. A thermal oxidation is used to formed a silicon oxide layer on the substrate. Subsequently, A control gate, a pass gate and second gate oxide are formed after the etching step. Next, an ion implantation step is applied to form the heavy doped source and drain of the pass gate. A second dielectric layer is deposited on the substrate, control gate and on the pass gate for the purpose of isolation. A contact window is then created by using photolithography and etching process. Finally, a metal layer is formed on the dielectric layer and the contact window is filled with the metal layer to serve as a bit line contact.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A new method is disclose to form a double poly electrically erasable programmable read only memory (EEPROM) with a narrow tunneling window smaller than that of the photolithography limitation. The EEPROM device includes source and drain regions are formed in the impurity region of the device.

Figure 1:
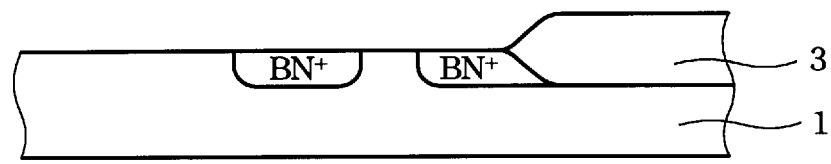
FIG. 1 is a cross section view of method of a semiconductor wafer illustrating the step of forming a field oxide region and buried N+ region in accordance with prior art.
Figure 2:
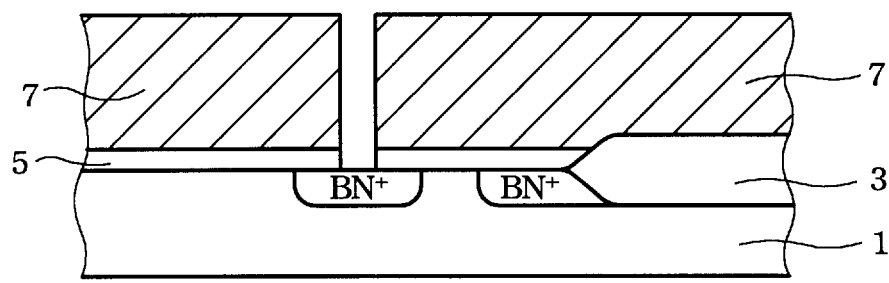
FIG. 2 is a cross section view of a conventional method of a semiconductor wafer illustrating the step of forming a gate oxide in accordance with prior art.
Figure 3:
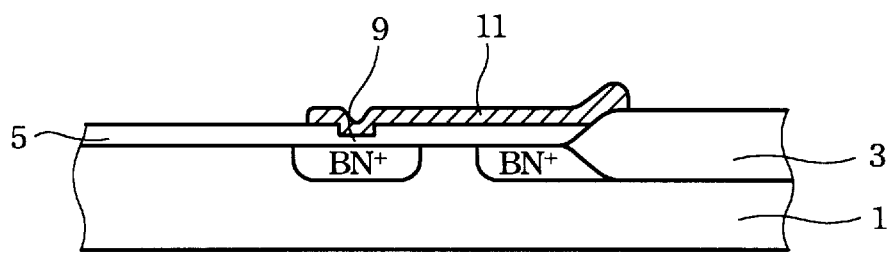
FIG. 3 is a cross section view of a semiconductor wafer illustrating the step of forming a floating gate in accordance with prior art.
Figure 4:
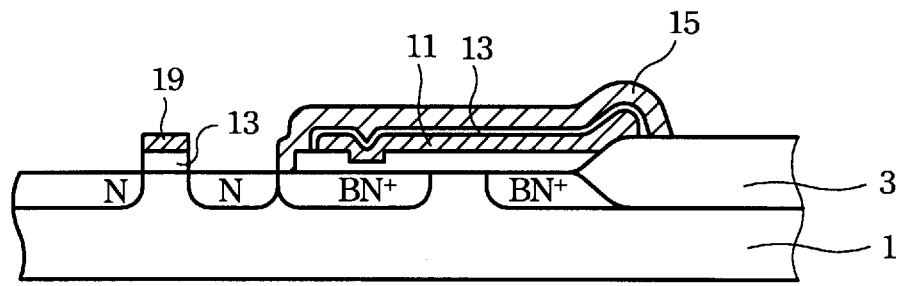
FIG. 4 is a cross section view of a semiconductor wafer illustrating the step of forming a first dielectric layer, control gate and pass gate in accordance with prior art.
Figure 5:
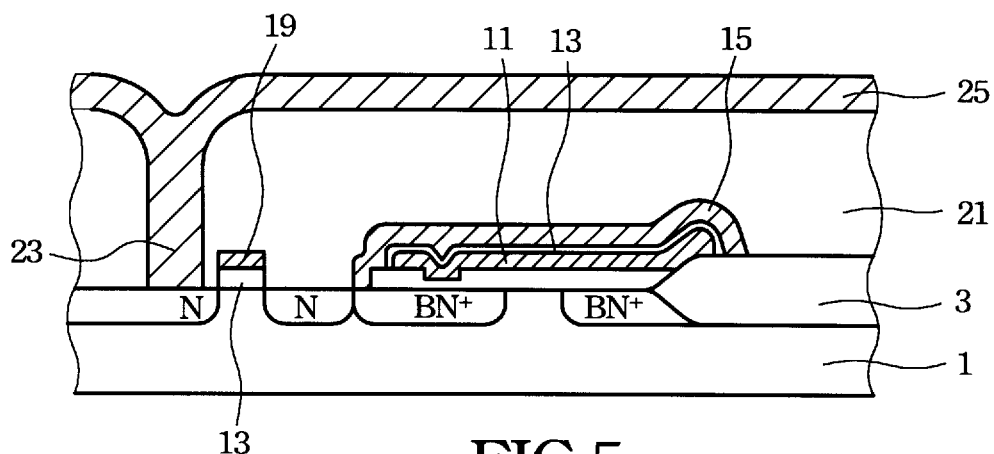
FIG. 5 is a cross section view of a semiconductor wafer illustrating the step of forming a second dielectric layer and a metal layer in accordance with prior art.
Figure 6:
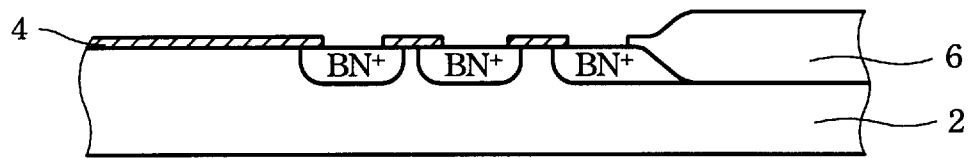
FIG. 6 is a cross section view of a semiconductor wafer illustrating the step of forming a first field oxide region and buried N+ region in accordance with the present invention.

The formation of the double poly electrically erasable programmable read only memory (EEPROM) described herein includes many process steps that are well known in the art. For example, the process of photolithography masking and etching is used extensively herein. As will be seen below, this technique can be used to form a double poly EEPROM. Referring to FIG. 6, In the preferred embodiment a silicon wafer includes a single crystal substrate 2 is shown. The single crystal substrate 2 is P-type with a <100> crystallographic orientation. A thick first field oxied region (FOX) 6 is created for purposes of isolation. Generally speaking, the first FOX region 6 is created via photolithography and dry etching steps to etch a silicon nitride-pad oxide composite layer 4. After photoresist is removed, and wet cleans, a thermal oxidation in an oxygen steam ambient is used to form the first FOX region 6, at a thickness about 7000–9000 angstroms. A photolithography and an etching steps are used again to etch the silicon nitride-pad oxide composite layer 4. Buried N+(BN+) impurity regions are defined after the etching process. An ion implant is then performed to create buried N+(BN+) impurity regions. The dosage of the ion implant is about the range of 3-5E15 atom/cm$^2$. The energy of the ion implant is about the range of 60–80 KeV. The next step of forming the EEPROM is to remove a photoresist which is formed on the silicon nitride-pad oxide composite layer 4.

Figure 15:
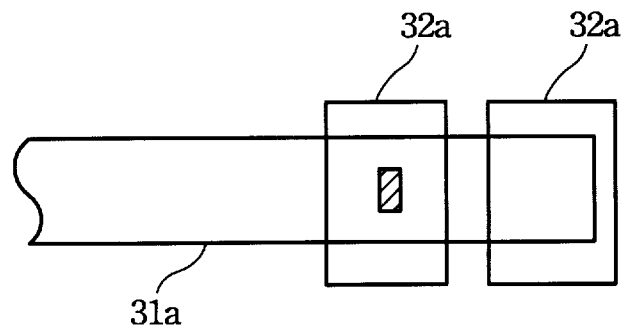
FIG. 15 to FIG. 17 are layerout structures according to present invention.

Referring to FIG. 15, a mask 31a is patterned on the substrate to define an active region. Then a mask 32a is used to cover a portion of the active region and define a buried N+(BN+) source and drain region. Further, a portion of the mask 32b covers a portion of the active region (32a and 32b are the same mask).

Figure 7:
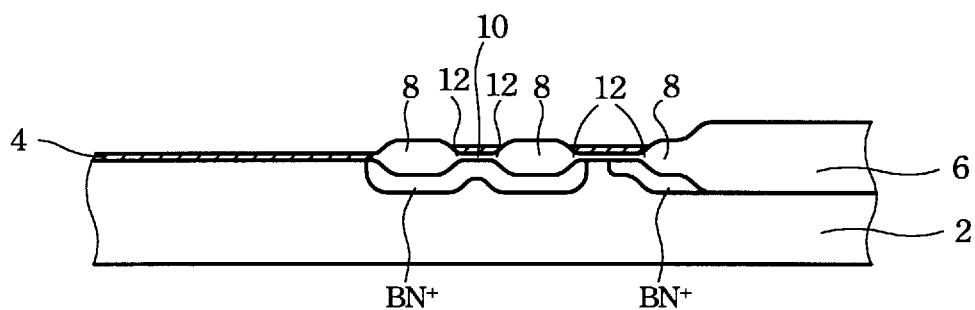
FIG. 7 is a cross section view of a semiconductor wafer illustrating the step of forming a second field oxide regions in accordance with the present invention.

As shown in FIG. 7, a thermal oxidation in an oxygen steam ambient is used to form a plurality of second FOX regions 8, at a thickness about 2000–4000 angstroms. A tunnel oxide region 10 between the second FOX regions 8 has a dimension beyond the photolithography limitation. In other words, by "squeezing" the tunnel oxide regions 10 by the formation of the bird beaks 12 of the second FOX regions 8, the tunnel oxide regions 10 is narrowed. To further explain, assume that the width of the tunnel oxide regions 10 is 0.5 micron. Assume further that the bird beaks 12 are each 0.15 micron, respectively. By adding the bird beaks 12, the tunnel oxide regions 10 is narrowed by, for example, 0.3 micron. Thus, the tunnel oxide regions 10 is now 0.2 micron in width.

Figure 8:
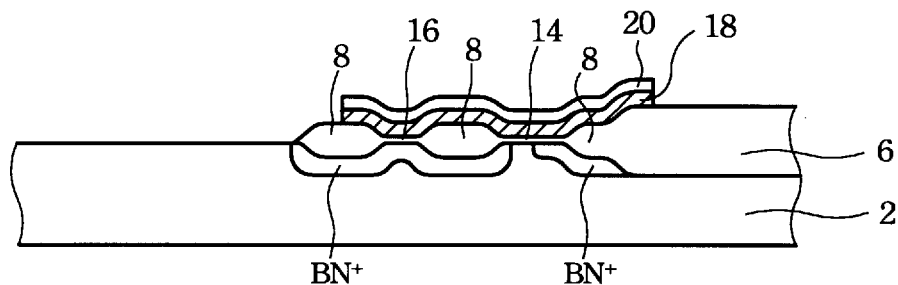
FIG. 8 is a cross section view of a semiconductor wafer illustrating the step of forming a floating gate oxide, tunnel oxide and floating gate in accordance with the present invention.

Turning to FIG. 8, the silicon nitride-pad oxide composite layer 4 is removed by wet etching. In this preferred embodiment, a thermal oxidation is used to formed a first gate oxide layer on the substrate 2 to have a thickness about 250–350 angstroms. The first gate oxide 14 is formed by the thermal oxidation at a temperature about 800°–900° C. Then a portion of the FOX regions 8, a portion of the first gate oxide 14 are covered by a photoresist. An etching step is then used to etch a portion of the first gate oxide 14 and to define a tunnel oxide region. Another thermal oxidation process is performed to form a tunnel oxide 16. In preferred embodiment, the thickness of the tunnel oxide 16 is about 90–110 angstroms. See FIG. 8, the first gate oxide 14 and the tunnel oxide 16 is formed on the substrate 2. A first polysilicon layer 18 is deposited on the first FOX 6, the second FOXs 8, the first gate oxide 14, the tunnel oxide 16 and the substrate 2. Typically, the thickness of the first polysilicon layer 18 is about 1000–3000 angstroms. A dielectric layer 20 is formed on the first polysilicon layer 18. The dielectric layer 20 is composed of triple composite layer including oxide\nitride\oxide (O\N\O). The thickness of the O\N\O layer 20 is about 250–400 angstroms. Then a photoresist is patterned on the dielectric layer 20. An etching step is used to define a floating gate 18 and a isolation layer 20. Then the photoresist is stripped. The first polysilicon layer 18 is formed using conventional chemical vapor deposition (CVD). Further, the first polysilicon layer 18 is chosen from doped polysilicon or in-situ doped polysilicon.

Figure 16:
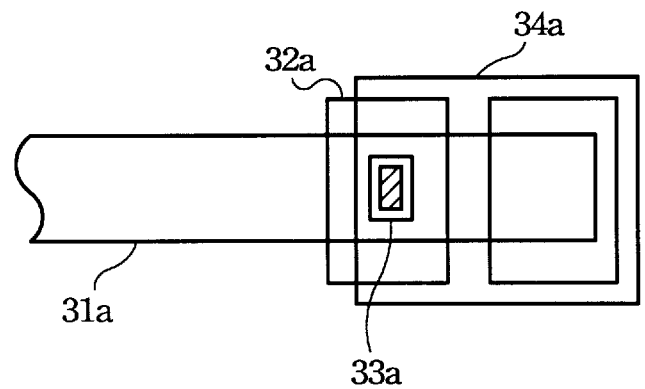

As shown in FIG. 16, a mask 33a is formed on the substrate to expose a portion of the N$^+$(BN$^+$) source/drain regions and to define a tunnel oxide region. A mask 34a is used to define a first polysilicon layer.

Figure 9:
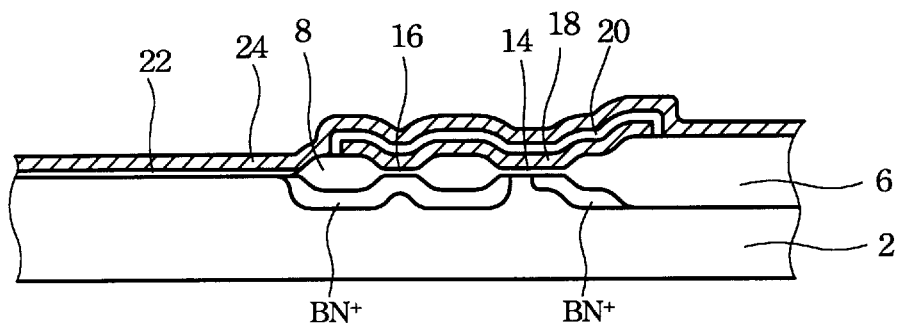
FIG. 9 is a cross section view of a semiconductor wafer illustrating the step of forming a first dielectric layer, a second polysilicon layer in accordance with the present invention.

As shown in FIG. 9, a thermal oxidation is used to formed a silicon oxide layer 22 to a thickness about 200–300 angstroms on the substrate 2. In the preferred embodiment, the silicon oxide layer 22 is formed by using an oxygen-steam ambient, at a temperature of between about 800° to 900° C. Alternatively, the silicon oxide 22 may be formed using other known oxide chemical compositions and procedures. Subsequently, a second polysilicon layer 24 is formed on the O\N\O layer 20 and silicon oxide layer 22 to a thickness about 3000–4000 angstroms. The second polysilicon layer 24 is used for forming a control gate and pass gate.

Figure 10:
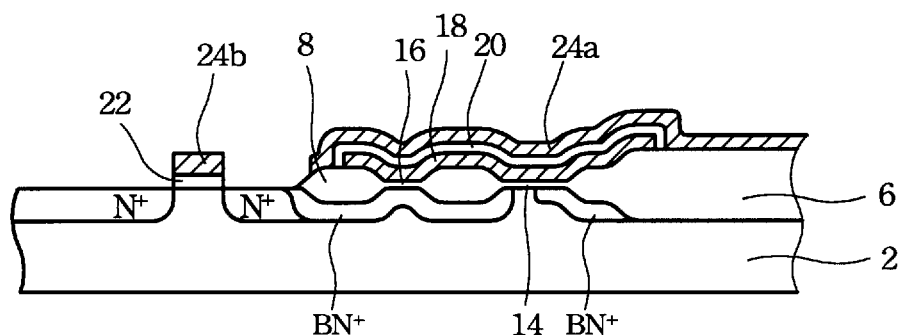
FIG. 10 is a cross section view of a semiconductor wafer illustrating the step of forming a pass gate and control gate in accordance with the present invention.

Next, as shown in FIG. 10, photolithography and etching are used to etch the second polysilicon layer 24. A control gate 24a, a pass gate 24b and pass gate oxide 22 are formed after the etching step. Next, as seen in FIG. 10, an ion implantation step is applied to form the heavy doped source and drain of the pass gate. In preferred embodiment, the dosage of the ion implant is about the range of 3-5E15 atom/cm$^2$. The energy of the ion implant is about the range of 60–80 KeV. In addition, a rapid thermal process is performed to drive the ions into the substrate 2.

Figure 11:
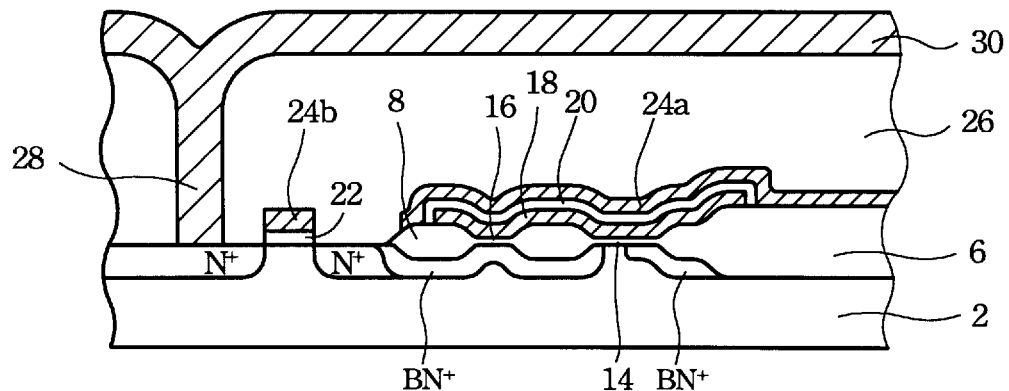
FIG. 11 is a cross section view of a semiconductor wafer illustrating the step of forming a second dielectric layer and a metal layer in accordance with the present invention.
Figure 12:
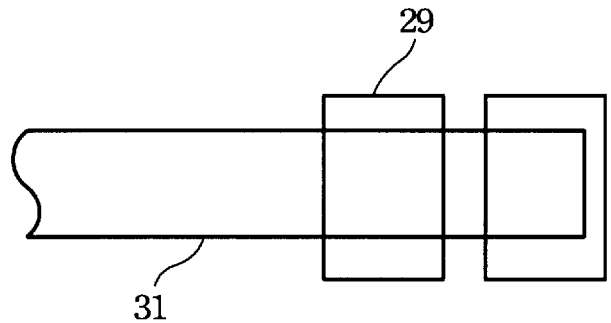
FIG. 12 to FIG. 14 are layerout structures according to prior art.
Figure 13:
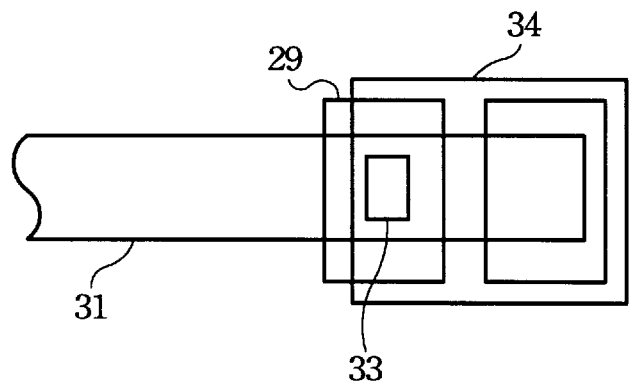
Figure 14:
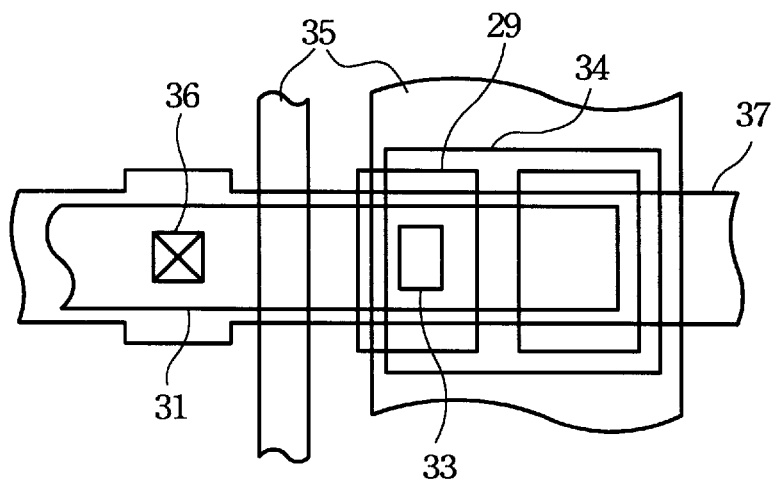

Turning to FIG. 11, a second dielectric layer 26 is deposited on the substrate 2, control gate 24a and on the pass gate 24b to a thickness about 4000–7000 angstroms for the purpose of isolation. A contact window 28 is then created by using photolithography and etching process. In preferred embodiment, the second dielectric layer 26 is composed of BPSG. Finally, a metal layer 30 is formed on the dielectric layer 26 and the contact window 28 is filled with the metal layer 30 to serve as a bit line contact. In this embodiment, the metal layer is aluminum. Then patterning and etching are used to etch the metal layer 30. Thus, an EEPROM is formed as shown in FIG. 11.

Figure 17:
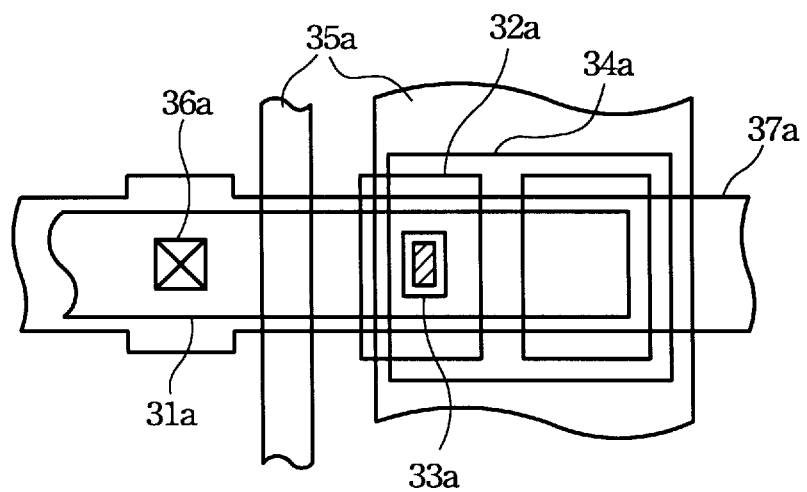

As shown in FIG. 17, a mask 35a is patterned to define a second polysilicon region and a mask 36a is used to define a contact hole in the active region. A mask 37a is then formed to define a metal bit line region.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming an EEPROM (electrically erasable programmable read only memory) on a semiconductor substrate, said method comprising:

forming a first field oxide (FOX) region on said substrate;

forming buried N$^+$ regions by ion implantation in said substrate;

forming a plurality of second field oxide (FOX) regions on said substrate, a tunnel oxide region between said plurality of second FOX regions being narrowed by the formation of the bird beaks of said plurality of second FOX regions;

forming a first gate oxide on said substrate between said plurality of second field oxide (FOX) regions by thermal oxidation;

forming a tunnel oxide on said substrate by thermal oxidation;

forming a first polysilicon layer on said tunnel oxide, said first gate oxide, said first FOX region and on said plurality of second FOX regions;

forming a first dielectric layer on said first polysilicon layer;

etching said first polysilicon layer and said first dielectric layer to define a floating gate;

forming a silicon oxide layer over said substrate;

forming a second polysilicon layer on said first dielectric layer and on said silicon oxide layer;

forming a control gate, a pass transistor and pass gate oxide by using patterning and etching processes to etch said second polysilicon layer and said silicon oxide;

forming impurity (source and drain) regions of said pass transistor;

forming a second dielectric layer on said control gate, said pass transistor and on said substrate for isolation;

forming a contact window in said second dielectric layer by using patterning and etching processes; and forming a metal layer on said second dielectric layer and in said contact window to serve as a bit line contact.

2. The method of claim 1, further comprises the following steps of forming said first field oxide region:

forming a silicon nitride-silicon dioxide composite layer on said substrate;

patterning a first photoresist on said silicon nitride-silicon dioxide composite layer;

etching said silicon nitride-silicon dioxide composite layer by using said first photoresist as a mask;

removing said first photoresist; and performing a first thermal oxidation in an oxygen steam ambient to form said first FOX (field oxide region) region.

3. The method of claim 2, further comprises the following steps of forming said buried N$^+$ regions:

patterning a second photoresist on said substrate;

etching said silicon nitride-silicon dioxide composite layer by using said second photoresist as a mask;

removing said second photoresist; and performing an ion implantation in said substrate by using said silicon nitride-silicon dioxide composite layer as a mask.

4. The method of claim 3, further comprises the step of forming said second field oxide region:

performing a second thermal oxidation in an oxygen steam ambient to form said plurality of second FOX (field oxide) regions on said substrate.

5. The method of claim 4, further comprises the following steps of forming said first gate oxide and said tunnel oxide:

removing a silicon nitride-pad oxide layer by wet etching;

forming a first gate oxide by using thermal oxidation;

patterning and etching said first gate oxide to define a tunnel region; and forming a tunnel oxide by thermal oxidation.

6. The method of claim 5, further comprises the following steps of forming said floating gate:

forming a first polysilicon layer on said substrate, said tunnel oxide, said floating gate oxide, said first FOX region and said a plurality of second FOX regions;

forming said first dielectric layer on said first polysilicon layer; and patterning a second photoresist on said first polysilicon layer; and etching said first polysilicon layer.

7. The method of claim 6, further comprises the following steps of forming said second gate oxide, said control gate and said pass gate:

forming said second gate oxide by thermal oxidation;

forming said second polysilicon layer on said second gate oxide; and patterning and etching said second polysilicon layer and said second gate oxide to form said control gate ans said pass gate.

8. The method of claim 7, further comprises the following steps of forming said source, drain of said pass gate transistor and said second dielectric layer:

forming said source, drain of said pass gate transistor using ion implantation; and forming a BPSG layer over said substrate to serve as said second dielectric layer.

9. The method of claim 8, further comprises the following steps of forming said contact window and said metal layer:

patterning a photoresist on said BPSG layer;

etching said BPSG layer;

forming said metal layer on said BPSG layer; and patterning and etching said metal layer.

10. The method of claim 1, wherein said first FOX region is formed to have a thickness about 7000–9000 angstroms.

11. The method of claim 1, wherein said plurality of second FOX regions are formed to have a thickness about 2000–4000 angstroms.

12. The method of claim 1, wherein said first gate oxide and said tunnel oxide is formed by thermal oxidation.

13. The method of claim 1, wherein the thickness of said first gate oxide is about 250–350 angstroms.

14. The method of claim 1, wherein the thickness of said tunnel oxide is about 90–110 angstroms.

15. The method of claim 1, wherein the thickness of said first polysilicon layer is about 1000–3000 angstroms.

16. The method of claim 1, wherein said first dielectric layer is formed of triple composition oxide\nitride\oxide layer.

17. The method of claim 16, wherein the thickness of said oxide\nitride\oxide layer is about 250–400 angstroms.

18. The method of claim 1, wherein the thickness of said second gate oxide is about 200–300 angstroms.

19. The method of claim 1, wherein the thickness of said second polysilicon layer is about 3000–4000 angstroms.

20. The method of claim 1, wherein said second dielectric layer is formed of BPSG.

21. The method of claim 20, wherein the thickness of said BPSG is about 4000–7000 angstroms.

22. The method of claim 1, wherein said metal layer is aluminum.

23. A method of forming an EEPROM (electrically erasable programmable read only memory) on a semiconductor substrate, said method comprising:

forming a first field oxide (FOX) region on said substrate;

forming buried $N^+$ regions by ion implantation in said substrate;

forming a plurality of second field oxide (FOX) regions on said substrate, a tunnel oxide region between said plurality of second FOX regions being narrowed by the formation of the bird beaks of said plurality of second FOX regions;

forming a first gate oxide on said substrate between said plurality of second field oxide (FOX) regions by thermal oxidation;

forming a tunnel oxide on said substrate by thermal oxidation;

forming a first polysilicon layer on said tunnel oxide, said first gate oxide, said first FOX region and on said plurality of second FOX regions;

forming a first dielectric layer on said first polysilicon layer;

etching said first polysilicon layer and said first dielectric layer to define a floating gate;

forming a silicon oxide layer over said substrate;

forming a second polysilicon layer on said first dielectric layer and on said silicon oxide layer;

forming a control gate, a pass transistor and pass gate oxide by etching said second polysilicon layer and said silicon oxide; and forming impurity (source and drain) regions of said pass transistor.

* * * * *